(12) United States Patent
Lee et al.

(10) Patent No.: US 12,144,226 B2
(45) Date of Patent: Nov. 12, 2024

(54) DISPLAY DEVICE INCLUDING TOUCH SENSOR AND METHOD OF MANUFACTURING THE SAME

(71) Applicant: LG DISPLAY CO., LTD., Seoul (KR)

(72) Inventors: Yangsik Lee, Gyeonggi-do (KR); JiHyun Jung, Gyeonggi-do (KR); SuChang An, Seoul (KR); JaeGyun Lee, Gyeonggi-do (KR); Ruda Rhe, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/370,636

(22) Filed: Jul. 8, 2021

(65) Prior Publication Data

US 2021/0335898 A1   Oct. 28, 2021

Related U.S. Application Data

(63) Continuation of application No. 16/175,307, filed on Oct. 30, 2018, now Pat. No. 11,088,220.

(30) Foreign Application Priority Data

Oct. 31, 2017   (KR) .................. 10-2017-0144326

(51) Int. Cl.
  *H10K 59/40*    (2023.01)
  *G06F 3/041*    (2006.01)
  (Continued)

(52) U.S. Cl.
  CPC .......... *H10K 59/40* (2023.02); *G06F 3/0412* (2013.01); *G06F 3/0416* (2013.01);
  (Continued)

(58) Field of Classification Search
  CPC ........ G09G 3/30; G09G 3/3225; G06F 3/044; G06F 3/0445; G06F 3/0446;
  (Continued)

(56) References Cited

U.S. PATENT DOCUMENTS 11,088,220 B2 * 8/2021 Lee .................. G06F 3/0416
2014/0110683 A1   4/2014 Huang et al.
(Continued)

FOREIGN PATENT DOCUMENTS

CN      101673013 A    3/2010
CN      106371653 A    2/2017
(Continued)

*Primary Examiner* — Jimmy H Nguyen
(74) *Attorney, Agent, or Firm* — Birch, Stewart, Kolasch & Birch, LLP

(57) ABSTRACT

A display device includes a substrate including a display area and a pad area; a thin film transistor in the display area; a light emitting film layer on the thin film transistor; an encapsulation layer on the light emitting film layer; a touch buffer layer on the encapsulation layer; a bridge, first touch electrodes and second touch electrodes disposed on the touch buffer layer; a touch insulating film disposed between the bridge and the first touch electrodes and the second touch electrodes; a touch pad in the pad area; a touch sensing line connected to the first touch electrodes; and a touch driving line connected to the second touch electrodes, wherein at least one of the touch sensing line and the touch driving line is provided on a side surface of the encapsulation layer.

22 Claims, 15 Drawing Sheets

(51) Int. Cl.
*G06F 3/044* (2006.01)
*H10K 50/844* (2023.01)
*H10K 59/12* (2023.01)
*H10K 59/131* (2023.01)
*H10K 71/00* (2023.01)

(52) U.S. Cl.
CPC .......... *G06F 3/0445* (2019.05); *G06F 3/0446* (2019.05); *H10K 50/844* (2023.02); *H10K 59/131* (2023.02); *G06F 2203/04103* (2013.01); *G06F 2203/04111* (2013.01); *G06F 2203/04112* (2013.01); *H10K 59/1201* (2023.02); *H10K 71/00* (2023.02)

(58) Field of Classification Search
CPC ................ G06F 3/0412; G06F 3/0416; G06F 2203/04103; G06F 2203/04112; G06F 2203/04111; H01L 27/323; H01L 27/3276; H01L 51/5253; H01L 51/56; H01L 2227/323; H10K 71/00; H10K 50/844; H10K 59/40; H10K 59/131
USPC ........ 345/76, 173, 174; 315/169.3; 313/463, 313/504
See application file for complete search history.

(56) References Cited

U.S. PATENT DOCUMENTS

| | | |
|---|---|---|
| 2015/0060806 A1 | 3/2015 | Park et al. |
| 2015/0170575 A1 | 6/2015 | Kwak et al. |
| 2015/0185915 A1 | 7/2015 | Lim |
| 2015/0185942 A1 | 7/2015 | Kim et al. |
| 2017/0024037 A1 | 1/2017 | Ishizaki et al. |
| 2017/0069692 A1 | 3/2017 | Lee et al. |
| 2017/0153747 A1 | 6/2017 | Yoon et al. |
| 2017/0308212 A1 | 10/2017 | Jin et al. |
| 2018/0033830 A1* | 2/2018 | Kim .................... H01L 27/3248 |
| 2018/0033832 A1* | 2/2018 | Park ................... H01L 51/0023 |
| 2018/0040672 A1* | 2/2018 | Park ....................... H10K 59/88 |
| 2018/0095566 A1 | 4/2018 | Lee et al. |
| 2018/0226454 A1* | 8/2018 | Liu ....................... H01L 27/323 |

FOREIGN PATENT DOCUMENTS

| | | |
|---|---|---|
| EP | 3 293 765 A1 | 3/2018 |
| EP | 3 410 275 A1 | 12/2018 |
| KR | 10-2015-0078337 A | 7/2015 |
| KR | 10-2016-0124301 A | 10/2016 |
| KR | 10-2017-0029162 A | 3/2017 |
| KR | 10-2017-0106621 A | 9/2017 |

* cited by examiner

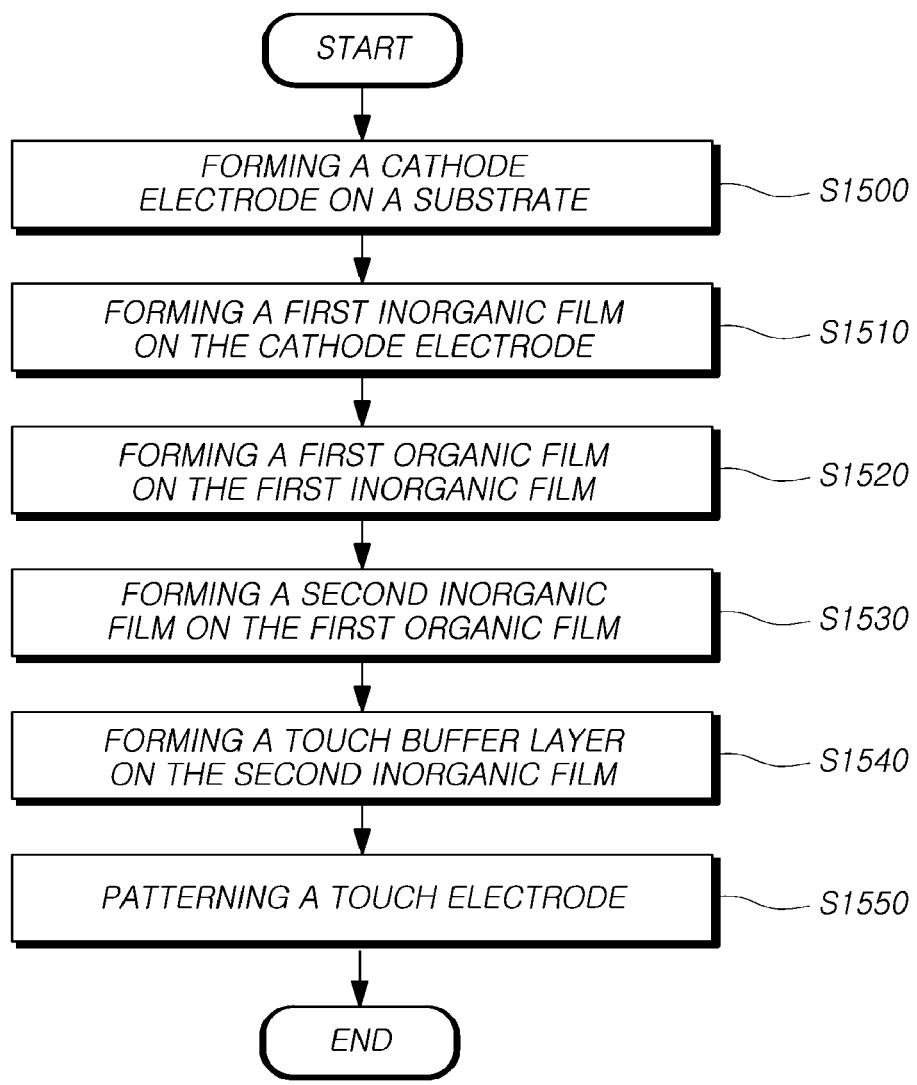

DISPLAY DEVICE INCLUDING TOUCH SENSOR AND METHOD OF MANUFACTURING THE SAME

CROSS-REFERENCE TO RELATED APPLICATION

This application is a Continuation of U.S. patent application Ser. No. 16/175,307, filed Oct. 30, 2018 (now U.S. Pat. No. 11,088,220 issued on Aug. 10, 2021), which claims the priority benefit of Korean Patent Application No. 10-2017-0144326, filed on Oct. 31, 2017 in the Korean Intellectual Property Office, all of these applications being hereby incorporated by reference into the present application.

BACKGROUND

1. Technical Field

The present disclosure relates to a display device including a touch sensor and a method of manufacturing the display device.

2. Description of the Related Art

As the information-oriented society has been developed, there has been a growing need for various display devices for displaying images. Recently, various types of display devices, such as a liquid crystal display (LCD) device, a plasma display panel (PDP) device, and an organic light emitting display (OLED) device, have been developed and utilized.

Among these display devices, the organic light emitting display device has received considerable attention recently due to its self-emitting property, high response speed, wide viewing angle, high contrast and improved color gamut, and being thinner.

In addition, the display devices can be operated by a user command input through various input devices, such as a keyboard, a mouse, or the like, and, as one of the input devices, a touch panel display device has been developed so that the user can intuitively and conveniently input a command by touching the screen of the display device with a special stylus or one or more fingers. For example, a touch panel is disposed on the screen of the display device, and then the user can input a command to the display device by touching a certain point on the screen of the display device. Since the touch panel detects touch coordinates, it can be referred to as a touch sensing unit.

In addition, the display device includes a display area where an image is displayed and a bezel area that corresponds to an edge area of the display area. Recently, there has been an attempt to reduce the width of the bezel area for design reasons. However, in a case where the touch panel is mounted on the display device, since the number of signals for conveying the touch signal further increases, in order to output the touch signal to the outside, there are some limitations in reducing the width of the bezel area.

SUMMARY

It is one object of some embodiments of the present disclosure to provide a display device including a touch sensor and a method for manufacturing the display device capable of simplifying processes.

It is another object of some embodiments of the present disclosure to provide a display device including a touch sensor and a method for manufacturing the display device capable of reducing a bezel area by reducing process deviations.

According to one aspect consistent with various embodiments of the present disclosure, provided is a display device including a substrate including a display area and a pad area applying a signal to the display area; an encapsulation layer disposed in the display area and including a first inorganic film, a second inorganic film disposed on the first inorganic film, and a first organic film disposed between the first inorganic film and the second inorganic film; a touch buffer layer disposed on the encapsulation layer; and a touch sensing unit disposed on the touch buffer layer, and including a touch sensor in which at least one inorganic film of the first inorganic film and the second inorganic film is disposed in a part of the pad area and a touch buffer layer is disposed on the at least one inorganic film.

According to another aspect consistent with various embodiments of the present disclosure, provided is a method of manufacturing a display device comprising disposing a first inorganic film on a substrate, disposing a first organic film on the first inorganic film, disposing a second inorganic film on the first organic film, forming a touch buffer layer on the second inorganic film. Furthermore, a touch electrode on the touch buffer layer, and the touch buffer layer, at least one inorganic film of the first inorganic film and the second inorganic film, and the touch buffer layer are patterned when the touch electrode is patterned.

According to some embodiments of the present disclosure, provided are a display device including a touch sensing unit capable of simplifying processes and reducing the manufacturing cost, and a method of manufacturing the display device.

According to some embodiments of the present disclosure, provided are a display device including a touch sensing unit capable of reducing the size of the non-display area by reducing process margin deviation, and a method of manufacturing the display device.

BRIEF DESCRIPTION OF THE DRAWINGS

FIG. 15 is a flowchart illustrating a method of manufacturing a display device according to some embodiments of the present disclosure.

DETAILED DESCRIPTION OF THE EMBODIMENTS

Figure 1:
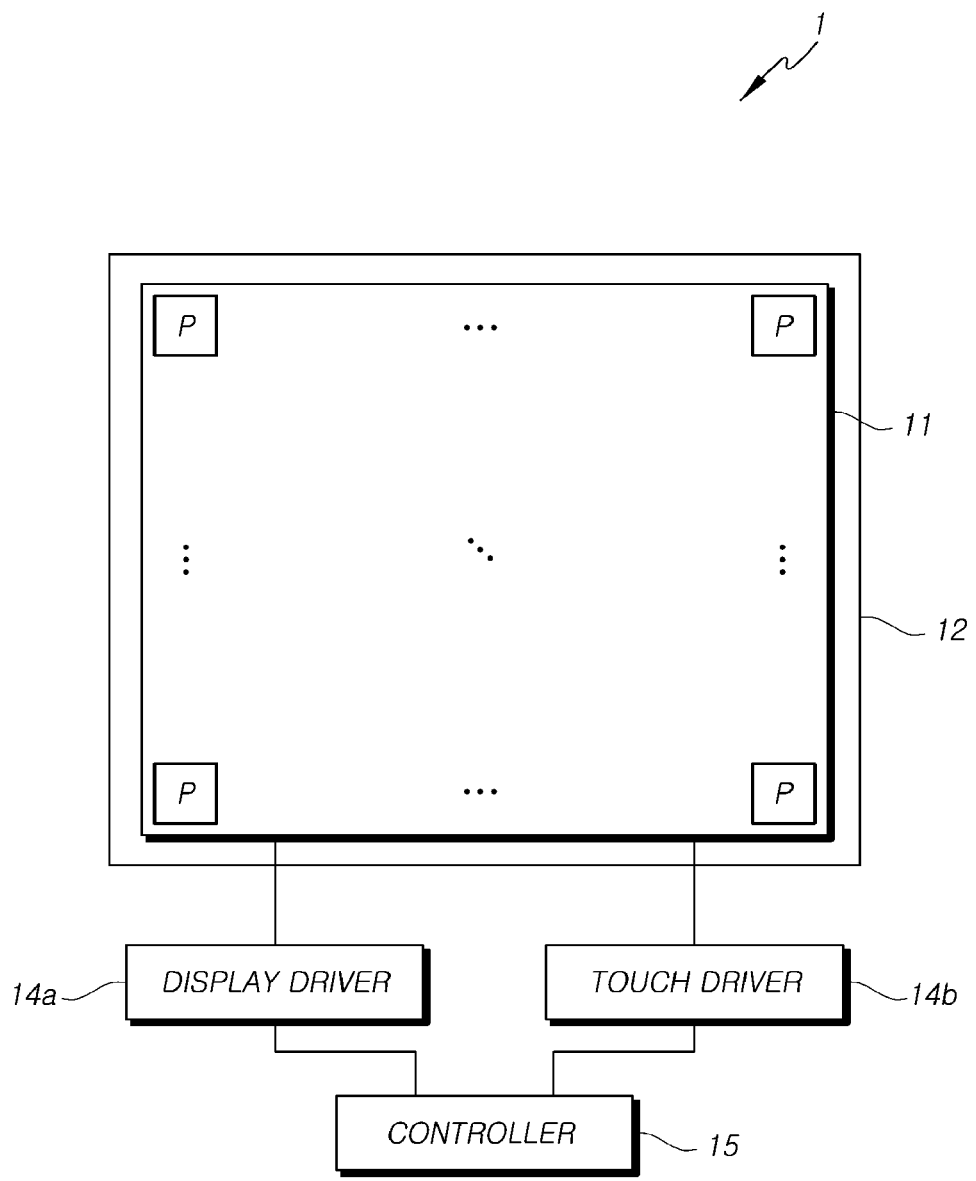
FIG. 1 is a view illustrating a display device according to some embodiments of the present disclosure.

Hereinafter, the present embodiments of the disclosure will be described in detail with reference to the accompanying drawings. In denoting elements of the drawings by reference numerals, the same elements will be referenced by the same reference numerals although the elements are illustrated in different drawings. In the following description of the disclosure, detailed description of known functions and configurations incorporated herein may be omitted when it may make the subject matter of the disclosure rather unclear.

Terms, such as first, second, A, B, (a), or (b) may be used herein to describe elements of the disclosure. Each of the terms is not used to define essence, order, sequence, or number of an element, but is used merely to distinguish the corresponding element from another element. When it is mentioned that an element is "connected" or "coupled" to another element, it should be interpreted that another element may be "interposed" between the elements or the elements may be "connected" or "coupled" to each other via another element as well as that one element is directly connected or coupled to another element.

FIG. 1 is a view illustrating a display device according to some embodiments of the present disclosure. All the components of the display device according to all embodiments of the present disclosure are operatively coupled and configured.

Referring to FIG. 1, a display device 1 can include a display panel 11, a touch sensing unit 12, a display driver 14a, a touch driver 14b, and a controller 15.

The display panel 11 can include a plurality of pixels P arranged in a matrix. Each pixel P can include an organic light emitting diode (OLED) and a pixel circuit supplying a driving current to the OLED. The pixel circuit can receive a data signal corresponding to a gate signal, generate a driving current, and supply the generated driving current to the OLED. In addition, the display panel 11 can be driven with a range of voltages. The range of voltages applied to the display panel 11 can include a first voltage EVDD and a second voltage EVSS having a lower level than the first voltage EVDD. The display panel 11 can be driven by the first voltage EVDD and the second voltage EVSS. The first voltage EVDD can be supplied for each pixel column and the second voltage EVSS can be a common voltage commonly supplied to the plurality of pixels P.

The touch sensing unit 12 can be disposed over the display panel 11 and can detect a touch from a finger or a stylus pen. In this case, the touch includes not only a direct touch, but approaching at certain intervals.

The display driver 14a can transmit the gate signal and the data signal to the display panel 11. The display driver 14a can receive an image signal and then generate a data signal. In this case, a single display driver 14a is illustrated, but the present disclosure is not limited to this and other variations are possible. The number of display drivers can be determined depending on the size or resolution of the display panel 11. The display driver 14a can be implemented as an integrated circuit.

The touch driver 14b can transmit a touch driving signal to the touch sensing unit 12, and receive a touch sensing signal in response to the touch driving signal. The touch driver 14b can be implemented as an integrated circuit.

The controller 15 can control individually the display driver 14a and the touch driver 14b. In addition, the controller 15 can supply an image signal to the display driver 14a. Further, the controller 15 can control any or all appropriate components of the display device to operate the display device.

Figure 2:
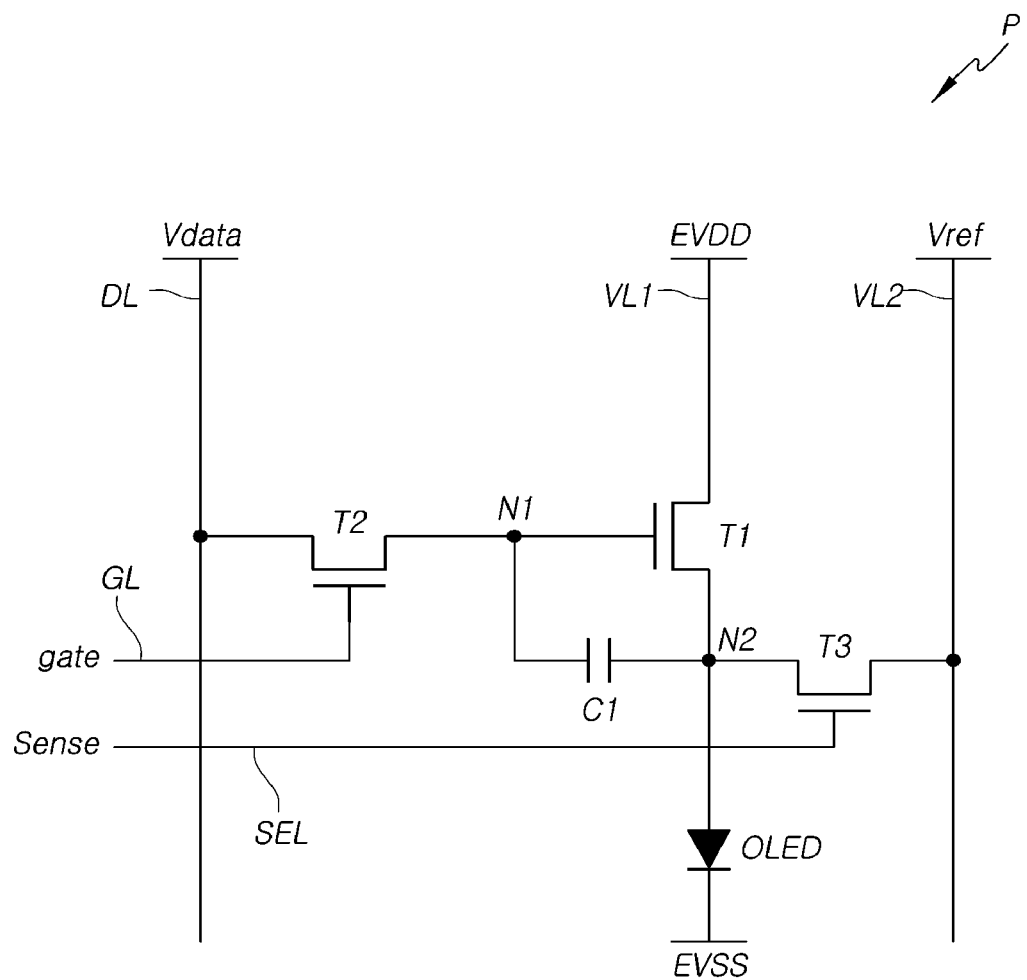
FIG. 2 is a circuit diagram illustrating a pixel according to some embodiments of the present disclosure.

FIG. 2 is a circuit diagram illustrating a pixel according to some embodiments of the present disclosure.

Referring to FIG. 2, a pixel P (e.g., pixel P of FIG. 1) can include a pixel circuit including an organic light emitting diode OLED, a first to third transistors T1 to T3, and a capacitor C1. In this case, the first transistor T1 can be a driving transistor supplying a drive current to the organic light emitting diode OLED.

The first transistor T1 can have a first touch electrode connected with a first voltage line VL1 through which the first voltage EVDD is applied, a second touch electrode connected with a second node N2, and a gate electrode connected with a first node N1. The second transistor T2 can have a first touch electrode connected with a data line DL, a second touch electrode connected with the first node N1, and a gate electrode connected with a gate line GL. The third transistor T3 can have a first touch electrode connected with the second node N2, a second touch electrode connected with a second voltage line VL2, and a third electrode connected with a sensing control signal line SEL. In this case, the sensing control signal line SEL can be a gate line GL. The organic light emitting diode OLED can have an anode electrode connected with the second node N2 and a cathode electrode to which the second voltage EVSS is applied. The cathode electrode can be connected to the second voltage line. Accordingly, a driving current supplied by the first transistor (T1) can flow through the organic light emitting diode OLED. In addition, the capacitor C1 can be connected between the first node N1 and the second node N2 and thus can maintain the voltage applied to the first node N1. The first voltage EVDD can be applied to the first voltage line VL1 and first reference voltage Vref1 can be applied to the second voltage line VL2.

Figure 3:
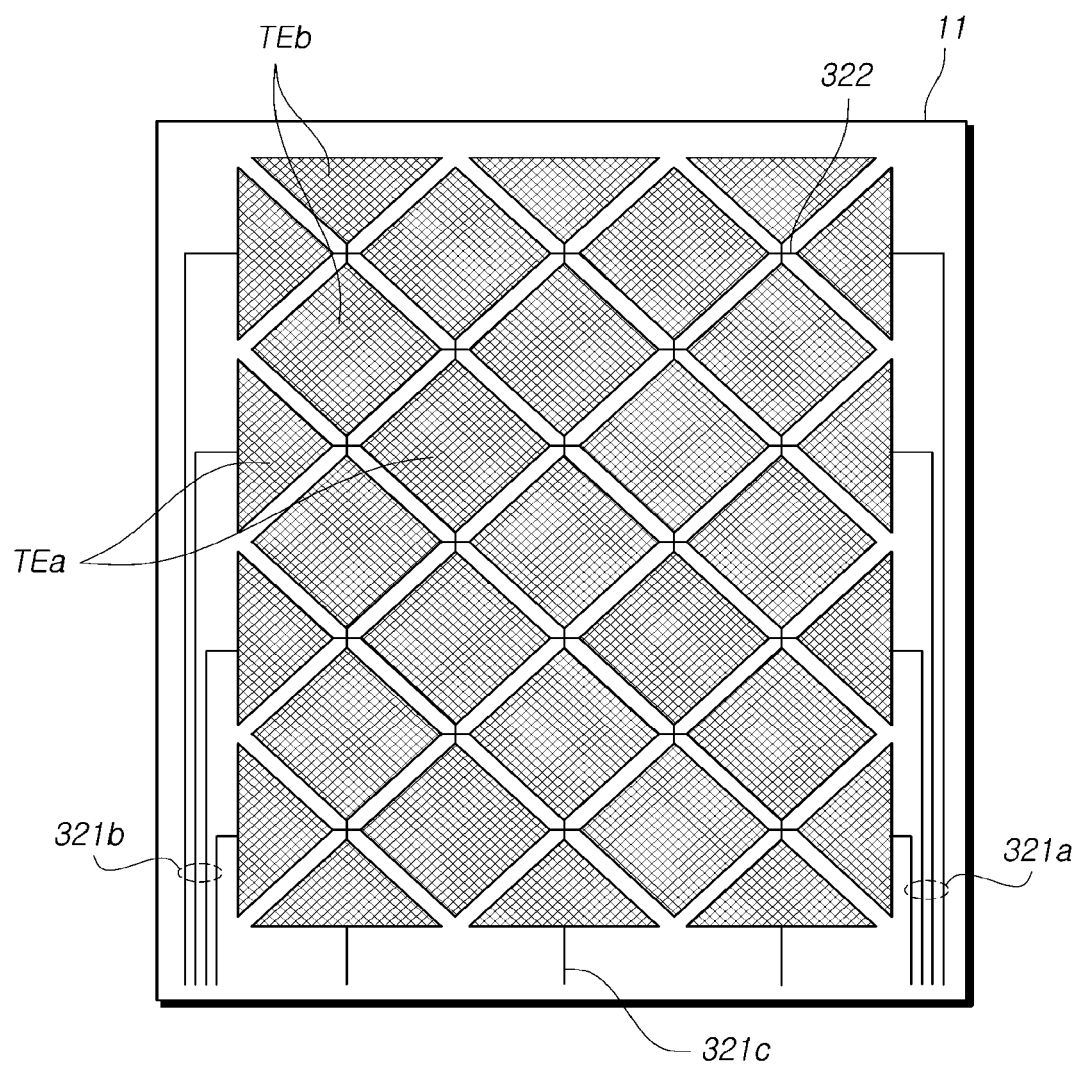
FIG. 3 is a plan view illustrating a touch sensing unit according to some embodiments of the present disclosure.

FIG. 3 is a plan view illustrating a touch sensing unit according to some embodiments of the present disclosure. For instance, the touch sensing unit of FIG. 3 can be used as the touch sensing unit 12 of FIG. 1.

Referring to FIG. 3, a touch sensing unit is disposed over a display panel 11, can include a plurality of first touch electrodes TEa and a plurality of second touch electrodes TEb. The plurality of first touch electrodes TEa can correspond to one or more touch driving electrodes TEa and the plurality of second touch electrodes TEb can correspond to one or more touch sensing electrodes TEb. The plurality of first touch electrodes TEa can be connected to each other through a bridge 322 in a row direction and form a plurality of electrode rows. The plurality of second touch electrodes TEb can be connected to each other through the bridge 322 in a column direction and form a plurality of electrode columns. In this case, the plurality of first touch electrodes TEa and the plurality of second touch electrodes TEb can be arranged in a 4×3 matrix, but the present disclosure is not limited thereto and includes other variations. A touch insulating film 122 (e.g., see FIG. 9) can comprise a touch contact hole 125 through which a second touch electrode 123 can contact the bridge 322 on a touch buffer layer 119. The touch buffer layer 119 and the touch insulating film 122 can extend to a pad area 200.

One or more touch driving signals can be applied to first touch electrodes Tea and one or more touch driving signals corresponding to the touch driving signals can be applied to the second touch electrodes TEb. The first touch electrodes TEa and the second touch electrodes TEb can be disposed in the same layer over the display panel 11, but the present disclosure is not limited thereto.

The bridge 322 can include a first bridge that can connect a first touch electrode TEa to one or more other first touch electrodes. The bridge 322 can also include a second bridge that can connect a second touch electrode TEb to one or more other second touch electrodes. To prevent direct connections between the first touch electrodes TEa and the second touch electrodes TEb, resulting from intersecting of the bridges with each other, a first bridge 322 connecting the first touch electrodes TEa can be arranged in a different layer from the first touch electrodes TEa and the second touch electrodes TEb, and the first bridge 322 can be connected to the first touch electrodes TEa through one or more vias (or holes). A second bridge 322 connecting the second touch electrodes TEb can be arranged in the same layer as one or more first touch electrodes TEa and one or more second touch electrodes TEb, and be connected to the second touch electrodes TEb in the same layer. Accordingly, an insulating film can be arranged between the first bridge 322 connecting the first touch electrodes TEa and the second bridge 322 connecting the second touch electrodes TEb.

In addition, the first touch electrode TEa and the second touch electrode TEb can be formed by the patterning of a conductive metal layer. In addition, the first touch electrode TEa and the second touch electrode TEb can be formed of a transparent material such as indium tin oxide ITO. In addition, the patterned first touch electrode TEa and the second touch electrode TEb and the bridges 322 can have an electrode pattern formed in a mesh, and the first touch electrode TEa and the second touch electrode TEb can have a plurality of openings. Since the first touch electrode TEa and the second touch electrode TEb are formed of an ITO electrode or have openings, light emitted from the display device can be transmitted by the first touch electrode TEa and the second touch electrode TEb or emit out through the plurality of openings.

The patterns of the first touch electrode TEa and the second touch electrode TEb and the bridges 322 formed in a mesh can be referred to as touch electrode wiring. The first touch electrode TEa and the second touch electrode TEb can be connected to a touch driving line 321a, 321b enabling a driving signal to be applied to a touch electrode, and a touch sensing line 321c conveying a sensing signal generated in response to a touch event detected through the touch electrode. One or both of the touch driving line 321a, 321b or the touch sensing line 321c can be provided on a side surface of an encapsulation layer 116, 117, 118 (e.g., see FIG. 9). One or both of the touch driving line 321a, 321b or the touch sensing line 321c can be provided on a side surface of a touch buffer layer 119 or touch insulating film 122.

Figure 4:
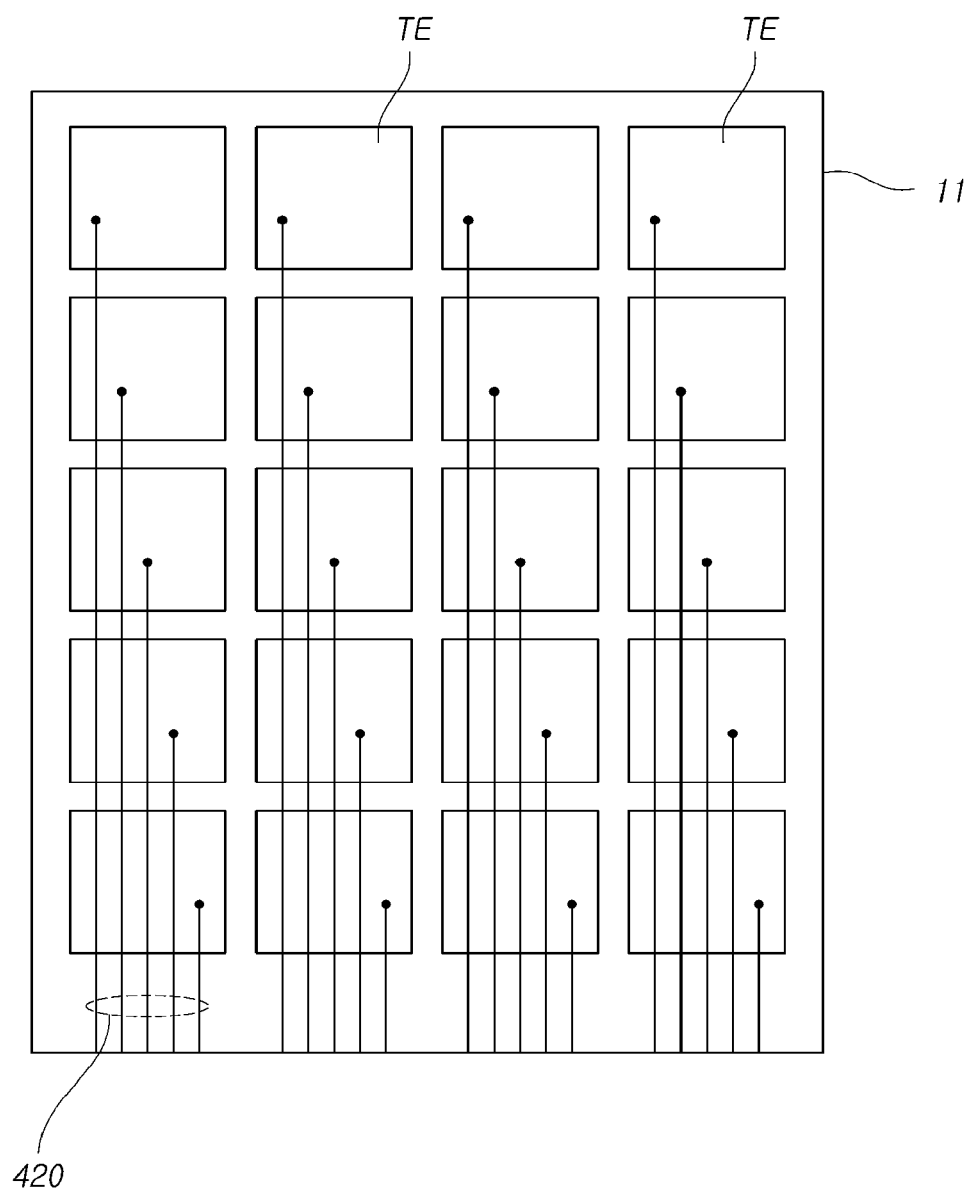
FIG. 4 is a plan view illustrating a touch sensing unit according to some embodiments of the present disclosure.

FIG. 4 is a plan view illustrating a touch sensing unit according to some embodiments of the present disclosure.

Referring to FIG. 4, a touch sensing unit is disposed on a display panel, and a plurality of touch electrodes TE having a predetermined area can be arranged in a matrix on the display panel 11. In addition, a plurality of touch lines 420 can be connected to each touch electrode TE to receive touch sensing signals therefrom. The touch line 420 can be disposed in a lower portion of the touch electrode and can contact an area of the touch electrode TE. Since the touch electrode TE and the touch line 420 can be arranged inside the display panel 11, it is possible to provide the display device in a manner where a separate touch panel is not included on the display panel 11, and therefore a thinner display panel 11 can be provided.

FIGS. 5 to 9 are sectional views illustrating a manufacturing procedure according to some embodiments of the present disclosure.

Figure 5:
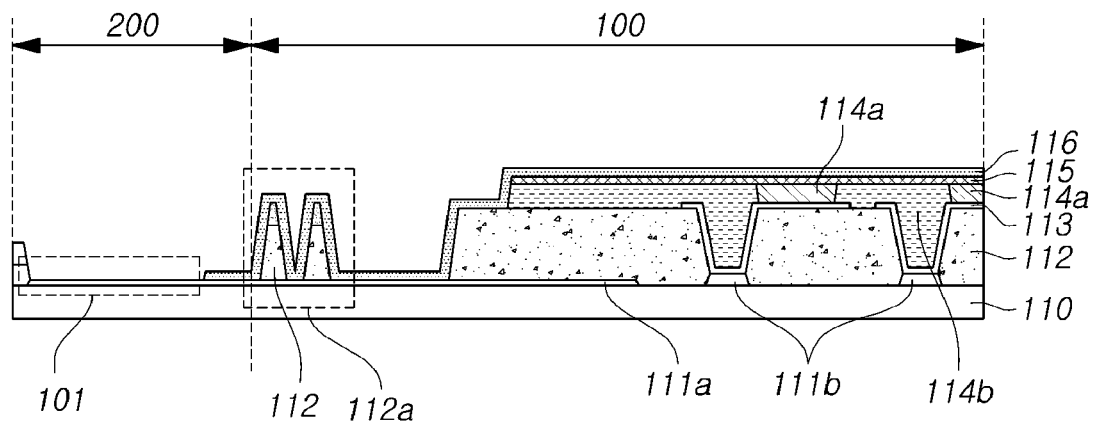
FIGS. 5 to 9 are sectional views illustrating a manufacturing procedure according to some embodiments of the present disclosure.

Referring to FIG. 5, a substrate has a display area 100 and a pad area 200, and a thin film transistor, a gate line applying a gate signal to the thin film transistor, a data line applying a data signal to the thin film transistor can be formed over the display area 100. The substrate 110 can include polyamide, but the present disclosure is not limited thereto. In addition, when the data line is formed on the substrate 110, the source electrode and the drain electrode 111b of the thin film transistor and a signal line 111a extending from the pad area 200 towards the display area 100 can be formed at the same time. The signal line 111a can extend from the display area 100 to the pad area 200. The pad area comprises a touch pad 101. The signal line 111a is exposed in the pad area 200 and therefore can serve as a pad for connecting to an external device. But, the present disclosure is not limited thereto. In addition, an external device that is connected to the touch pad 101 can be a data driver, a gate driver, or the like. In addition, the external device can be a printed circuit board PCB on which the data and gate drivers can be mounted. But, the present disclosure is not limited thereto.

A planarization film 112 can be disposed on the drain electrode 111b. Then, the planarization film 112 is patterned, and an anode electrode 113 and a drain electrode 111b can be formed to be connected to each other. A bank 114b can be formed on the anode electrode 113, and an organic light emitting film 114a can be formed in a cavity formed in the bank 114b. A cathode electrode 115 can be formed on the bank 114b in which the organic light emitting film 114a is formed. The bank 114b in which the organic light emitting film 114a is formed can be referred to as a light emitting layer. The cathode electrode 115 can be a common electrode. A first inorganic film 116 can be formed on the cathode electrode 115. When the first inorganic film 116 is formed, a dam 112a can be formed over a portion at which the pad area 200 and the display area 100 are adjacent to each other. The dam 112a can be formed when the planarization film 112 is formed. The dam 112a can have a dual structure such as being composed of two layers or peaks. In addition, when the first inorganic film 116 is formed, the first inorganic film 116 can be formed not to cover the pad area 200, the film being formed by any patterning technique using a mask. The first inorganic film 116 can cover an upper part of the dam 112a. But, the present disclosure is not limited thereto. In addition, a display area 100 and a pad area 200 can be defined relative to the dam 112a on the substrate 110. However, the present disclosure is not limited thereto, and pad area 200 can be an area in which a signal line 111a disposed on the substrate is exposed or an area in which a conductor disposed on the signal line 111a is exposed. The conductor disposed on the signal line 111a can be a second touch electrode 123 illustrated in FIG. 9.

Figure 6:
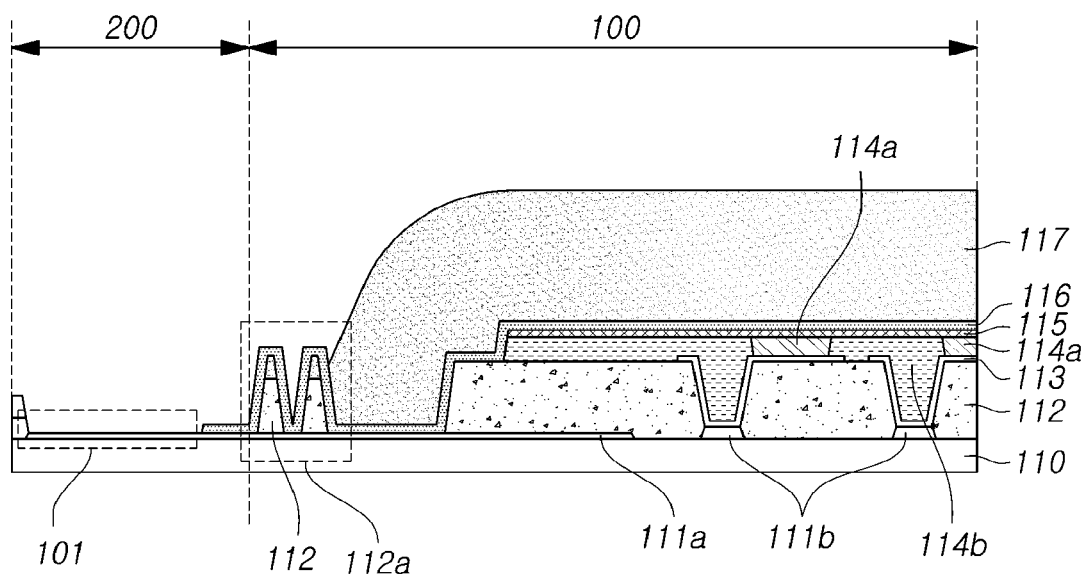

Referring to FIG. 6, a first organic film 117 is formed on the first inorganic film 116. In order to protect the organic light emitting film 114a, a thick layer can be disposed on the organic light emitting film 114a to prevent foreign substances such as moisture from penetrating the organic light emitting film 114a. However, there are some limitations to increase the thickness of the first inorganic film 116. Accordingly, in order to protect the organic light emitting film 114a, the first organic film 117, of which the thickness can be increased, can be disposed on the first inorganic film 116. The dam 112a serves to prevent the first organic film 117 from penetrating into the pad area 200.

Figure 7:
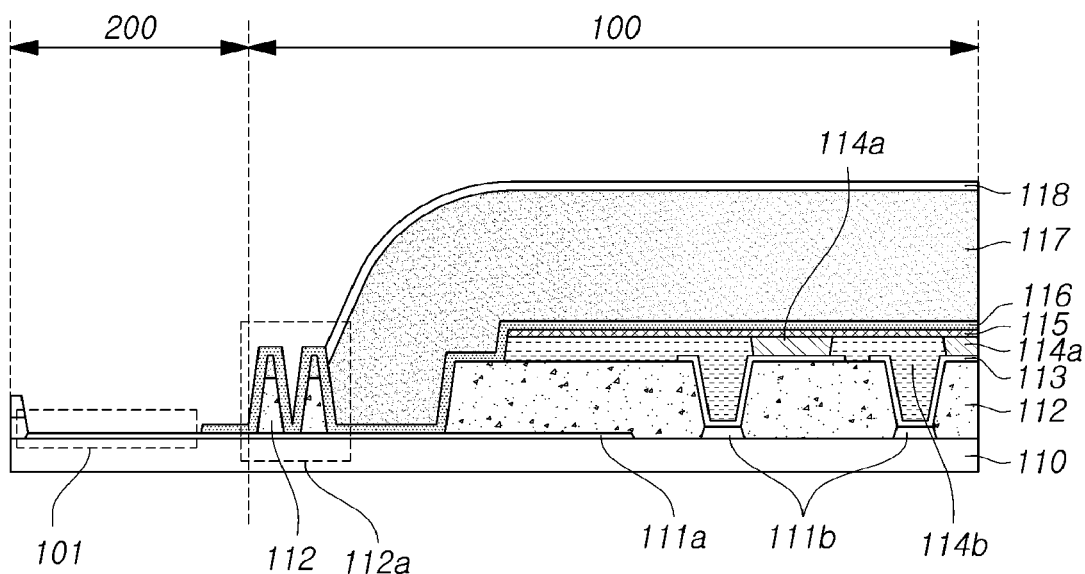

Referring to FIG. 7, a second inorganic film 118 can be formed on the first organic film 117. The second inorganic film 118 can cover the upper portion of the dam 112a formed by the first inorganic film 116. When the first inorganic film 116 is formed, it is patterned using a mask, but the second inorganic film 118 can be formed without using a mask. The deposited first inorganic film 116, first organic film 117 and second inorganic film 118 can be referred to as an encapsulation layer.

Figure 8:
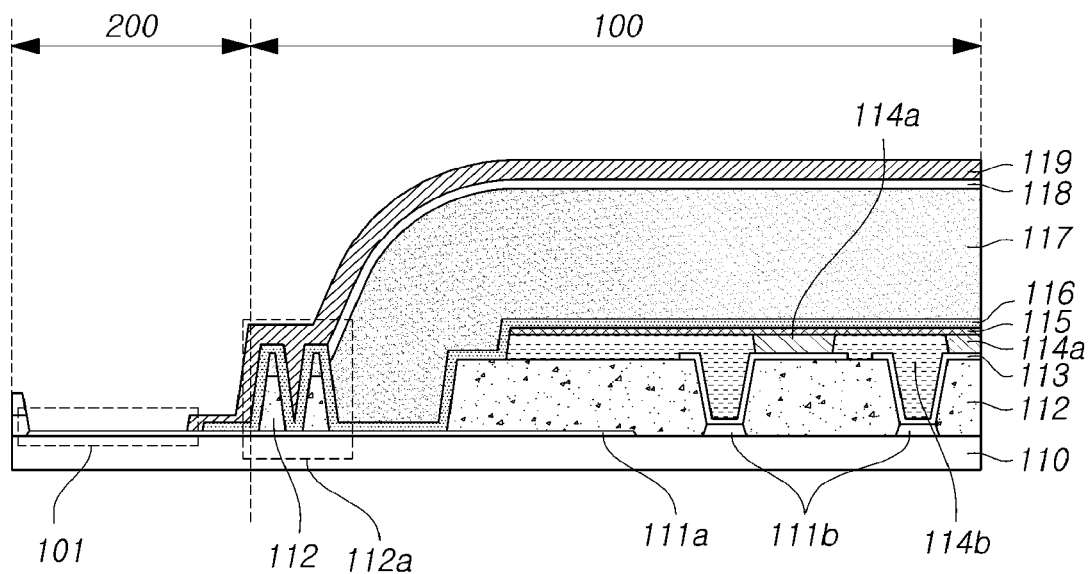

Referring to FIG. 8, a touch buffer layer 119 can be formed on the second inorganic film 118. The touch sensing unit can be mounted on the encapsulation layer by the patterning of a touch electrode, and the encapsulation layer can be damaged while the touch electrode is formed. To solve this problem, the touch buffer layer 119 can be formed on the encapsulation layer. The touch buffer layer can be formed without using a mask. The touch buffer layer 119 can be formed with an inorganic film. The touch buffer layer 119 serves to prevent the substrate from being damaged, but is not limited to preventing formation of a defect while the touch electrode is formed.

Figure 9:
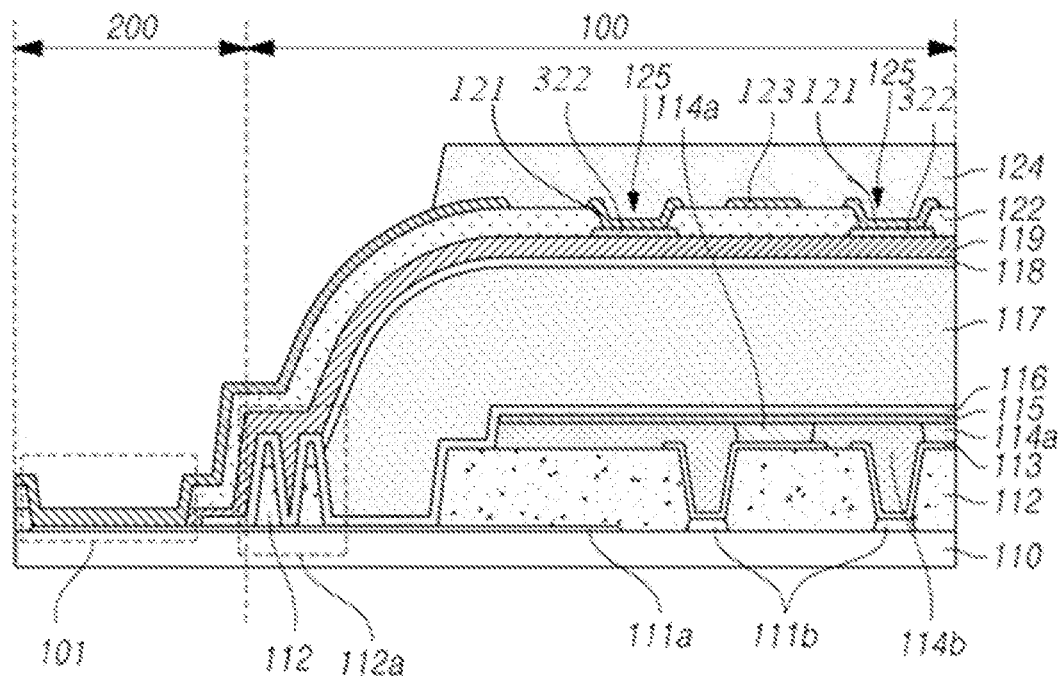

Referring to FIG. 9, a first touch electrode 121 and a second touch electrode 123 can be formed on the touch buffer layer 119. The first touch electrode 121 can include a bridge 322, as illustrated in FIG. 3, and the second touch electrode 123 can include a plurality of first touch electrodes TEa and/or a plurality of second touch electrodes TEb, as illustrated in FIG. 3. The bridge 322 can be disposed on a layer different from the plurality of first touch electrodes TEa and the plurality of second touch electrodes TEb. A touch insulating film 122 can be disposed between the first touch electrode 121 and the second touch electrode 123. A protective layer 124 can be formed on the second touch electrode 123. The first touch electrode 121 can be the touch electrode TE illustrated in FIG. 4 and the second touch electrode 123 can be the touch line 420 illustrated in FIG. 4.

The first touch electrode 121 can be formed first on the touch buffer layer 119. When the first touch electrode 121 is formed, the first touch electrode 121 can be patterned using a mask, or when the first touch electrode 121 is formed, the touch buffer layer 119 and the second inorganic film 118, which are disposed under the first touch electrode 121, can be patterned. Accordingly, when the first touch electrode 121 is formed, the touch buffer layer 119 and the second inorganic film 118 are patterned and one mask can be used because a separate patterning is not required. At this time, in a case where the first inorganic film 116 has not been patterned in previous process, the first inorganic film 116 can be also patterned when the first touch electrode 121 is formed. Accordingly, the manufacturing process of the display device 1 can be simplified and the cost can be reduced. At this time, the second inorganic film 118 and the touch buffer layer 119 which are formed in the pad area 200 are removed and as a result a signal line can be exposed. In addition, since the second inorganic film 118 and the touch buffer layer 119 can be patterned using a single mask, a margin in the mask process can be set small. That is, if two mask processes are performed, a margin of each mask process is required to be set, but, if a single mask process is performed, a margin of the single mask process is required to be set, and thereby it is possible to set a smaller margin than performing a mask process twice. As a result, the area of the display area on the substrate 110 can be increased and the area of the pad area can be reduced. Thus, a bezel area can be designed smaller.

After the first touch electrode 121 has been patterned, the touch insulating film 122 is deposited, and, after the touch insulating film 122 has been deposited, the second touch electrode 123 can be formed on the touch insulating film 122 by patterning. At this time, the second touch electrode 123 can be formed on a signal line 111a exposed in the pad area. In addition, the signal line 111a can contact the second touch electrode 123. As a result, a signal can be conveyed to the second touch electrode 123 through the signal line 111a. As the protective layer 124 is disposed on the second touch electrode 123, the second touch electrode 123 can be protected. The protective layer 124 can be an organic film or an inorganic film. One or both of the touch driving line 321a, 321b or the touch sensing line 321c can be provided on a side surface of the encapsulation layer 116, 117, 118. One or both of the touch driving line 321a, 321b or the touch sensing line 321c can be provided on a side surface of the touch buffer layer 199 or touch insulating film 122. The touch pad 101 can comprise upper and lower pad electrodes. The signal line 111a can be the lower pad electrode. The second touch electrode 123 can be the upper pad electrode. The lower pad electrode/signal line 111a can be the same material as the source electrode and drain electrode 111b. The upper pad electrode can be made of the same material as the touch driving line 321a or the touch sensing line 321c.

FIGS. 10 to 14 are sectional views illustrating a manufacturing procedure of a pad area and a display area adjacent to the pad area in a display device according to some embodiments of the present disclosure.

Figure 10:
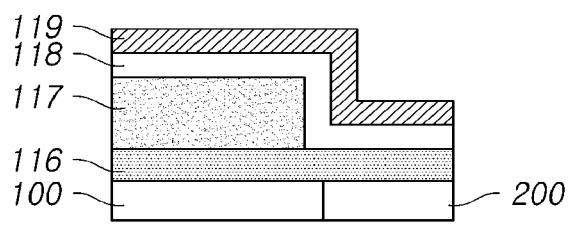
FIGS. 10 to 14 are sectional views illustrating a manufacturing procedure of a pad area and a display area adjacent to the pad area in a display device according to some embodiments of the present disclosure.

Referring to FIG. 10, a first inorganic film 116 can be formed on a substrate having a display area 100 and a pad area 200. A first organic film 117 can be disposed on the first inorganic film 116. The first organic film 117 can be disposed only on the display area 100. A second inorganic film 118 can be formed on the first organic film 117. At this time, since a mask is not used, the second inorganic film 118 is not patterned, and therefore the second inorganic film 118 can be formed both the display area 100 and the pad area 200. A touch buffer layer 119 can be formed on the second inorganic film 118.

Figure 11:
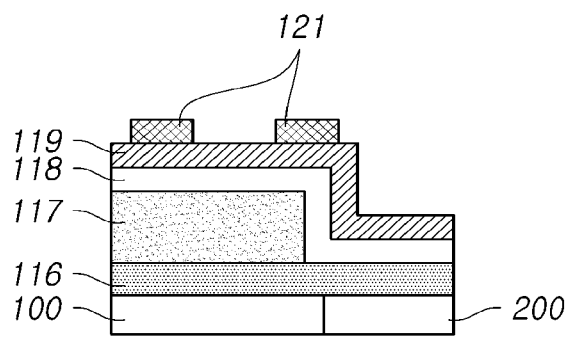

Referring to FIG. 11, after the touch buffer layer 119 has been formed, a first touch electrode 121 can be formed on the touch buffer layer 119. The first touch electrode 121 can be formed using a mask.

Figure 12:
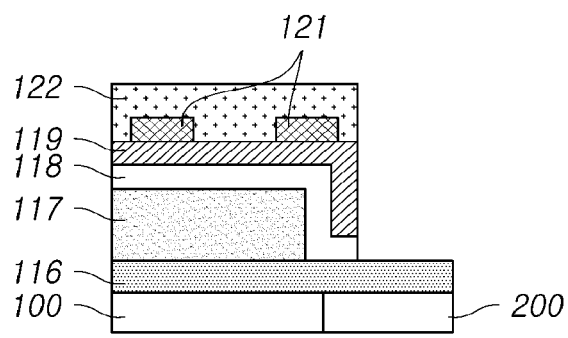

Referring to FIG. 12, after the first touch electrode 121 has been formed, a touch insulating film 122 can be formed on the first touch electrode 121. The touch insulating film 122 located on the pad area 200 can be etched. The touch insulating film 122 can be an inorganic film, and when the touch insulating film 122 is etched, since the first inorganic film 116 and the second inorganic film 118, which are located under the touch insulating film 122, can be etched together, thus the pad area 200 can be exposed. The exposing of the pad area 200 can cause a signal line located in the pad area 200 to be exposed.

Figure 13:
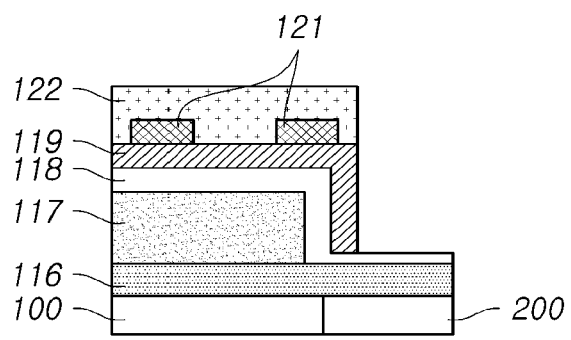
Figure 14:
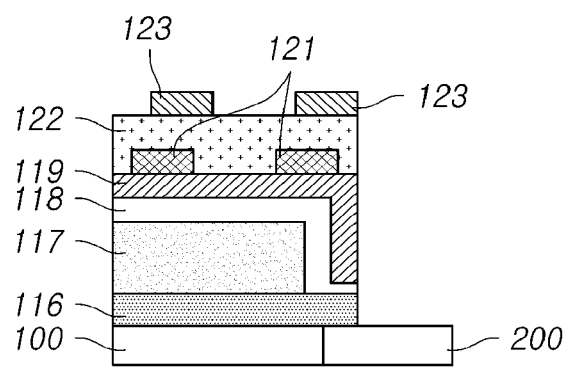

However, even though the touch insulating film 122 is etched, the first inorganic film 116 and/or at least a part of the second inorganic film 118 can remain in the pad area 200, as illustrated in FIG. 13. Accordingly, as illustrated in FIG. 14, while patterning is performed to form a second touch electrode 123 on the touch insulating film 122b, the first inorganic film 116 and/or the second inorganic film 118 which remains in the pad area 200 can be removed. As such, a signal line can be exposed in the pad area 200. A protective layer 124 can be further formed on the second touch electrode 123. The first inorganic film 116, second inorganic film 118, and touch buffer layer 119 can be deposited in sequence over an outer edge of the area with the exposed signal line, of the pad area 200.

FIG. 15 is a flowchart illustrating a method of manufacturing a display device according to some embodiments of the present disclosure.

Referring to FIG. 15, according to the method of manufacturing the display device, a display area and a pad area can be formed on a substrate. A thin film transistor, a light emitting layer including an organic light emitting film contacting at least a part of the thin film transistor, and a cathode electrode formed on the light emitting layer can be formed on the substrate (S1500). One or more pixels including the thin film transistor and one or more signal lines can be formed in the display area and the pad area respectively. In addition, a dam can be formed in the display area adjacent to the pad area. The dam can have a dual structure such as being composed of two layers or peaks. The dam can be formed using a planarization film disposed under the light emitting layer. But, the present disclosure is not limited thereto.

A first inorganic film can be disposed on a cathode electrode and then patterned (S1510). The first inorganic film can be deposited on the dam.

A first organic film can be disposed on the first inorganic film (S1520). The thickness of the first organic film can be over a predetermined value, and therefore foreign substances can be prevented from penetrating the light emitting layer. In addition, the dam serves to prevent the first organic film from penetrating into the pad area. The dam serves as a reference to define the display area and the pad area. However, the present disclosure is not limited thereto, and pad area 200 can be an area in which a signal line 111*a* disposed on the substrate is exposed or an area in which a conductor disposed on the signal line 111*a* is exposed. The conductor disposed on the signal line 111*a* can be a second touch electrode 123 described below.

A second inorganic film can be disposed on the first organic film (S1530). Since the second inorganic film is not patterned, it can be disposed on the first organic film without using a mask. Accordingly, a process for patterning the second inorganic film can be omitted. The first inorganic film, first organic film and second inorganic film can be referred to as a encapsulation layer.

A touch buffer layer can be formed on the second inorganic film (S1540). The first inorganic film, first organic film and second inorganic film can be damaged by heat, and, in a case where a touch sensing unit including a touch electrode is disposed on the second inorganic film, a process for patterning the touch electrode, or the like may be required. The first inorganic film, first organic film and second inorganic film may be damaged by a process for patterning the touch electrode. To solve or address this problem, the forming of the touch buffer layer can serve to prevent the first inorganic film, first organic film and second inorganic film, which are formed in earlier processes, from being damaged.

A touch electrode on the touch buffer layer can be patterned (S1550). The touch buffer layer and the second inorganic film can be patterned when the touch electrode is formed. Accordingly, the number of required mask processes can be reduced, when the touch buffer layer and the second inorganic film are removed in the pad area by the etching of the touch buffer layer and the second inorganic film using a single mask. If the number of mask processes is reduced to one, a process margin can be set smaller when one mask process is performed than when two mask processes are performed, and therefore the size of the pad area on the substrate can be reduced. In a case where the first inorganic film is disposed in the pad area without the first inorganic film patterned, in the step S1520, the first inorganic film can be etched along with the touch buffer layer and the second inorganic film when they are etched.

In addition, the patterning of the touch electrode can cause the touch buffer layer and the second inorganic film in the pad area to be patterned and removed when a first touch electrode is patterned, among at least two touch electrodes. In addition, the patterning of the touch electrode can cause the touch buffer layer and the second inorganic film to be patterned and removed when the touch insulating film is removed by etching in the pad area. In addition, the patterning of the touch electrode can cause the touch buffer layer and the second inorganic film in the pad area to be patterned and removed when a second touch electrode on the touch insulating film is patterned.

The features, structures, configurations, and effects described in the present disclosure are included in at least one embodiment but are not necessarily limited to a particular embodiment. A person skilled in the art can apply the features, structures, configurations, and effects illustrated in the particular embodiment embodiments of the present disclosure to another one or more additional embodiment embodiments of the present disclosure by combining or modifying such features, structures, configurations, and effects. It should be understood that all such combinations and modifications are included within the scope of the present disclosure.

Although the exemplary embodiments have been described for illustrative purposes, a person skilled in the art will appreciate that various modifications and applications are possible without departing from the essential characteristics of the present disclosure. For example, the specific components of the exemplary embodiments can be variously modified. The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
    a substrate including a display area and a pad area;
    a thin film transistor in the display area, and including a source electrode and a drain electrode;
    a light emitting film layer including an anode electrode connected to the drain electrode, an organic light emitting film on the anode electrode, and a cathode electrode on the organic light emitting film;
    an encapsulation layer including a first inorganic film, a first organic film on the first inorganic film, and a second inorganic film on the first organic film;
    a touch buffer layer on the second inorganic film of the encapsulation layer;
    a first bridge, a second bridge, a plurality of first touch electrodes and a plurality of second touch electrodes disposed on the touch buffer layer;
    a touch insulating film disposed between the first bridge connecting the plurality of first touch electrodes and the second bridge connecting the plurality of second touch electrodes;
    a touch pad in the pad area, and including an upper pad electrode and a lower pad electrode;
    a touch sensing line connected to the plurality of first touch electrodes;
    a touch driving line connected to the plurality of second touch electrodes; and
    a signal line extending from the touch pad in the pad area to the display area, wherein the signal line is interposed between the first inorganic film of the encapsulation layer and the substrate in the display area, wherein at least one of the touch sensing line and the touch driving line is provided on a side surface of the encapsulation layer, wherein both of the touch buffer layer and the touch insulating film are disposed between the at least one of the touch sensing line and the touch driving line and the side surface of the encapsulation layer in a sectional view, wherein the first organic film of the encapsulation layer overlaps the at least one of the touch sensing line and the touch driving line provided on the side surface of the encapsulation layer, wherein the touch driving line is in contact with the signal line exposed in the pad area to cause a signal to be conveyed to the plurality of second touch electrodes through the signal line, wherein the first inorganic film and the second inorganic film extend toward an end of the display area, and the first inorganic film extends beyond an end of the second inorganic film toward the pad area, wherein the touch buffer layer covers a side portion of the first inorganic film and directly contacts the side portion of the first inorganic film, and wherein an end portion of at least a part of the touch buffer layer directly contacts both the upper pad electrode and the lower pad electrode where the upper pad electrode directly contacts the lower pad electrode.

2. The display device of claim 1, wherein the lower pad electrode of the touch pad is made of a same material as the signal line, and the upper pad electrode of the touch pad is made of a same material as the touch sensing line or the touch driving line.

3. The display device of claim 2, wherein the source electrode, the drain electrode and the signal line are made of a same material.

4. The display device of claim 3, further comprising a protective layer disposed on the plurality of first touch electrodes and the plurality of second touch electrodes.

5. The display device of claim 1, wherein the plurality of first touch electrodes and the plurality of second touch electrodes have an electrode pattern formed in a mesh.

6. The display device of claim 1, wherein the at least one of the touch sensing line and the touch driving line is provided on a side surface of the touch buffer layer or a side surface of the touch insulating film.

7. The display device of claim 1, wherein the touch sensing line electrically connects the plurality of first touch electrodes and the touch pad.

8. The display device of claim 7, wherein the touch driving line electrically connects the plurality of second touch electrodes and the touch pad.

9. The display device of claim 1, wherein the second inorganic film contacts the first inorganic film.

10. The display device of claim 9, further comprising a dam located at where the second inorganic film contacts the first inorganic film.

11. The display device of claim 10, wherein the first inorganic film is located on the dam.

12. The display device of claim 10, wherein a height of the at least one of the touch sensing line and the touch driving line provided on the side surface of the encapsulation layer is not less than a height of the dam at the display area.

13. The display device of claim 1, wherein the touch insulating film is interposed between the plurality of first touch electrodes and the plurality of second touch electrodes.

14. The display device of claim 1, wherein the first inorganic film contacts the signal line within the pad area.

15. The display device of claim 1, wherein a thickness of the first organic film is greater than a thickness of the first inorganic film and a thickness of the second inorganic film.

16. The display device of claim 1, wherein the touch buffer layer and the touch insulating film extend along the side surface of the encapsulation layer to at least a portion of the pad area while the touch buffer layer and the touch insulating film are located between the touch driving line and the encapsulation layer.

17. The display device of claim 1, wherein an end portion of the touch buffer layer contacts the first inorganic film, the upper pad electrode and the lower pad electrode in the pad area.

18. A display device comprising:
a substrate including a display area and a pad area;
a thin film transistor in the display area;
a light emitting film layer on the thin film transistor;
an encapsulation layer having a first inorganic film, an organic film on the first inorganic film, and a second inorganic film on the organic film, and on the light emitting film layer;
a touch buffer layer on the encapsulation layer;
a first bridge, a second bridge, a plurality of first touch electrodes and a plurality of second touch electrodes disposed on the touch buffer layer;
a touch insulating film disposed between the first bridge connecting the plurality of first touch electrodes and the second bridge connecting the plurality of second touch electrodes;
a touch pad in the pad area, and including an upper pad electrode and a lower pad electrode;
a touch sensing line connected to the plurality of first touch electrodes;
a touch driving line connected to the plurality of second touch electrodes; and
a signal line extending from the touch pad in the pad area to the display area, wherein the signal line is interposed between the first inorganic film of the encapsulation layer and the substrate in the display area, wherein at least one of the touch sensing line and the touch driving line is provided on a side surface of the encapsulation layer, wherein both of the touch buffer layer and the touch insulating film disposed between the at least one of the touch sensing line and the touch driving line and the side surface of the encapsulation layer in a sectional view, wherein the organic film of the encapsulation layer overlaps the at least one of the touch sensing line and the touch driving line provided on the side surface of the encapsulation layer, wherein the touch driving line is in contact with the signal line exposed in the pad area to cause a signal to be conveyed to the plurality of second touch electrodes through the signal line, wherein the first inorganic film and the second inorganic film extend toward an end of the display area, and the first inorganic film extends beyond an end of the second inorganic film toward the pad area, wherein the touch buffer layer covers a side portion of the first inorganic film and directly contacts the side portion of the first inorganic film, and wherein an end portion of at least a part of the touch buffer layer directly contacts both the upper pad electrode and the lower pad electrode where the upper pad electrode directly contacts the lower pad electrode.

19. The display device of claim 18, wherein the end portion of at least the part of the touch buffer layer disposed in the pad area directly contacts a top surface of the signal line extending from the touch pad in the pad area to the display area.

20. The display device of claim 18, wherein the lower pad electrode of the touch pad is made of a same material as the signal line, and the upper pad electrode of the touch pad is made of a same material as the touch sensing line or the touch driving line.

21. The display device of claim 18, wherein the at least one of the touch sensing line and the touch driving line is provided on a side surface of the touch buffer layer or a side surface of the touch insulating film.

22. The display device of claim 18, wherein an end portion of the touch buffer layer contacts the first inorganic film, the upper pad electrode and the lower pad electrode in the pad area.

* * * * *